(12) United States Patent
Zhu (10) Patent No.: US 9,524,910 B2
(45) Date of Patent: Dec. 20, 2016

(54) SEMICONDUCTOR DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/441,122

(22) PCT Filed: Nov. 19, 2012

(86) PCT No.: PCT/CN2012/084818
§ 371 (c)(1),
(2) Date: May 6, 2015

(87) PCT Pub. No.: WO2014/071653
PCT Pub. Date: May 15, 2014

(65) Prior Publication Data
US 2015/0340290 A1  Nov. 26, 2015

(30) Foreign Application Priority Data

Nov. 9, 2012  (CN) .......................... 2012 1 0448013

(51) Int. Cl.
*H01L 29/49* (2006.01)
*H01L 21/8234* (2006.01)
(Continued)

(52) U.S. Cl.
CPC ................. *H01L 21/823481* (2013.01); *H01L 21/823431* (2013.01); *H01L 21/823821* (2013.01); *H01L 21/845* (2013.01); *H01L 27/0886* (2013.01); *H01L 27/0924* (2013.01); *H01L 27/1211* (2013.01); *H01L 29/00* (2013.01); *H01L 29/0649* (2013.01); *H01L 29/1029* (2013.01);
(Continued)

(58) Field of Classification Search
CPC ................. H01L 21/823481; H01L 21/823431
See application file for complete search history.

(56) References Cited

U.S. PATENT DOCUMENTS

6,835,618 B1 * 12/2004 Dakshina-Murthy ... H01L 21/84
257/192
9,209,301 B1 * 12/2015 Nguyen ............ H01L 21/76251
(Continued)

*Primary Examiner* — Michael Shingleton
(74) *Attorney, Agent, or Firm* — Christensen Fonder P.A.

(57) ABSTRACT

A semiconductor device and a method for manufacturing the same. An example method may include: forming a first semiconductor layer and a second semiconductor layer sequentially on a substrate; patterning the second and first semiconductor layers to form an initial fin; forming an isolation layer on the substrate, wherein the isolation layer exposes partially the first semiconductor layer, and thus defines a fin above the isolation layer; and forming a gate stack intersecting the fin on the isolation layer, wherein the first semiconductor layer comprises a compound semiconductor, with at least one component whose concentration has a graded distribution in a stack direction of the first and second semiconductor layers.

10 Claims, 9 Drawing Sheets

(51) Int. Cl.
  *H01L 27/088* (2006.01)
  *H01L 29/165* (2006.01)
  *H01L 29/10* (2006.01)
  *H01L 29/06* (2006.01)
  *H01L 29/00* (2006.01)
  *H01L 21/8238* (2006.01)
  *H01L 21/84* (2006.01)
  *H01L 29/66* (2006.01)
  *H01L 27/092* (2006.01)
  *H01L 27/12* (2006.01)

(52) U.S. Cl.
  CPC ....... *H01L 29/165* (2013.01); *H01L 29/66545* (2013.01)

(56) References Cited

U.S. PATENT DOCUMENTS

| | | | |
|---|---|---|---|
| 2005/0145941 A1* | 7/2005 | Bedell | H01L 21/845 257/348 |
| 2007/0111435 A1* | 5/2007 | Kim | H01L 29/41791 438/253 |
| 2009/0035909 A1* | 2/2009 | Chang | H01L 21/82380 438/276 |
| 2010/0144121 A1* | 6/2010 | Chang | H01L 29/7851 438/478 |
| 2010/0301390 A1 | 12/2010 | Ko et al. | |
| 2011/0147811 A1 | 6/2011 | Kavalieros et al. | |
| 2011/0193178 A1 | 8/2011 | Chang et al. | |
| 2011/0210374 A1 | 9/2011 | Lochtefeld | |
| 2012/0074386 A1* | 3/2012 | Rachmady | B82Y 10/00 257/24 |
| 2012/0091528 A1 | 4/2012 | Chang et al. | |
| 2015/0076558 A1* | 3/2015 | Lee | H01L 29/16 257/190 |
| 2015/0097217 A1* | 4/2015 | Cheng | H01L 29/66795 257/288 |
| 2015/0270263 A1* | 9/2015 | Zhu | H01L 21/02274 257/386 |
| 2015/0270344 A1* | 9/2015 | Cheng | H01L 29/161 257/616 |
| 2015/0340290 A1* | 11/2015 | Zhu | H01L 21/82382 257/401 |
| 2015/0380556 A1* | 12/2015 | Ching | H01L 29/7849 257/351 |

* cited by examiner

SEMICONDUCTOR DEVICE AND METHOD FOR MANUFACTURING THE SAME

CROSS-REFERENCE TO RELATED APPLICATION

This application is a national phase application of PCT Application No. PCT/CN2012/084818, entitled "Semiconductor Device and Method for Manufacturing the Same," filed on Nov. 19, 2012, which claims priority to the Chinese Patent Application No. 201210448013.6, filed on Nov. 9, 2012, both of which are incorporated herein by reference in their entireties.

TECHNICAL FIELD

The present disclosure relates to the semiconductor technology, and particularly to semiconductor devices and methods for manufacturing the same.

BACKGROUND

Short channel effects are getting more significant as planar semiconductor devices are increasingly being scaled down. To this end, three-dimensional (3D) semiconductor devices, such as Fin Field Effect Transistors (FinFETs), have been proposed. Generally, a FinFET includes a fin formed vertically on a substrate and a gate stack intersecting the fin. As such, a channel is formed in the fin, and has a width defined basically by a height of the fin. Unfortunately, it is difficult to control fins formed on a wafer to have the same height during manufacture of an integrated circuit (IC), resulting in inconsistency in performance of devices across the wafer.

SUMMARY

The present disclosure aims to provide, among others, a semiconductor device and a method for manufacturing the same.

According to an aspect of the present disclosure, there is provided a method for manufacturing a semiconductor device, comprising: forming a first semiconductor layer and a second semiconductor layer sequentially on a substrate; patterning the second and first semiconductor layers to form an initial fin; forming an isolation layer on the substrate, wherein the isolation layer exposes partially the first semiconductor layer, and thus defines a fin above the isolation layer; and forming a gate stack intersecting the fin on the isolation layer, wherein the first semiconductor layer comprises a compound semiconductor, with at least one component whose concentration has a graded distribution in a stack direction of the first and second semiconductor layers.

According to another aspect of the present disclosure, there is provided a semiconductor device, comprising: a substrate; patterned first and second semiconductor layers sequentially formed on the substrate; an isolation layer formed on the substrate, wherein the isolation layer has a top surface located between top and bottom surfaces of the first semiconductor layer, and thus defines a fin above the isolation layer; a gate stack formed on the isolation layer and intersecting the fin, wherein the first semiconductor layer comprises a compound semiconductor, with at least one component whose concentration has a graded distribution in a height direction of the fin.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Hereinafter, the technology disclosed herein is described with reference to embodiments thereof shown in the attached drawings. However, it should be noted that those descriptions are just provided for illustrative purpose, rather than limiting the present disclosure. Further, in the following, descriptions of known structures and techniques are omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to an embodiment of the present disclosure, at least one semiconductor layer may be formed on a substrate by, for example, epitaxy. As such, in order to form fins having the same height during patterning the fins by, for example, etching, a depth by which the etching is performed into the substrate may be reduced as compared with the conventional technology (the depth may even be reduced to zero; in this case, the fins are formed entirely by the at least one semiconductor layer), and thus it is relatively easier to control the etching depth to be consistent. Further, it is relatively easier to control the epitaxial layer to be uniform in thickness. As a result, it is possible to improve uniformity in thickness for the finally-formed fins.

In a preferable embodiment of the present disclosure, the at least one semiconductor layer includes a stack of two or more semiconductor layers, among which adjacent semiconductor layers may have etching selectivity with respect to each other. Therefore, it is possible to selectively etch each of the semiconductor layers.

In a specific example, the stack comprises a first semiconductor layer and a second semiconductor layer sequentially formed on the substrate. As such, the first semiconductor layer is interposed between the substrate and the second semiconductor layer. To reduce defects due to mismatch of lattices between the first semiconductor layer and the underlying substrate and the overlying second semiconductor layer, the first semiconductor layer may be designed to have a structure matched with that of the substrate at an interface with the substrate as much as possible, and have a structure matched with that of the second semiconductor layer at an interface with the second semiconductor layer as much as possible. For example, this may be achieved by forming the first semiconductor layer to have a variable constituent, so that the constituent at the interface with the substrate is as much close to that of the substrate as possible and the constituent at the interface with the second semiconductor layer is as much close to that of the second semiconductor layer as possible. Meanwhile, the constituent may not be completely the same, to ensure that the first semiconductor layer has etching selectivity with respect to the second semiconductor layer and the substrate. For example, the first semiconductor layer may comprise a compound semiconductor, with at least one component whose concentration has a graded distribution (in a stack direction of the semiconductor layers).

In an embodiment of the present disclosure, after forming the fin, one (or more) of the semiconductor layers may be selectively etched, and thus narrowed (recessed) in a lateral direction. The lateral recess may be filled with a dielectric, to form a body spacer. In addition, an isolation layer is formed in such a way that the isolation layer exposes partially the body spacer. Therefore, the body spacer is located at the bottom of the finally-formed fin (a portion of the initially-formed fin surrounded by the isolation layer does not act as a true fin where a channel is to be formed).

In this way, at the bottom of the finally-formed fin, dielectric between a subsequently-formed gate and the fin is relatively thick due to the body spacer, and thus a resultant parasitic capacitance is relatively small.

According to an embodiment of the present disclosure, the isolation layer may be formed by depositing a dielectric material on the substrate and then etching it back. The dielectric material may substantially cover the initially-formed fin, and a portion of the dielectric material on top of the initial fin may have a thickness sufficiently less than that of a portion of the dielectric material on the substrate. For example, the portion of the dielectric material on top of the initial fin may have a thickness less than ⅓, preferably ¼, of the thickness of the portion of the dielectric material on the substrate. This may be implemented by, for example, High Density Plasma (HDP) deposition. In case of forming a plurality of initial fins, a portion of the dielectric material on top of each of the initial fins may have a thickness less than half of a spacing between the initial fin and its neighboring initial fin. As such, an etching depth may be reduced in the subsequent back-etching, and thus accuracy for controlling the etching may be improved.

The present disclosure may be presented in various forms, and some examples thereof will be described hereafter.

Figure 1:
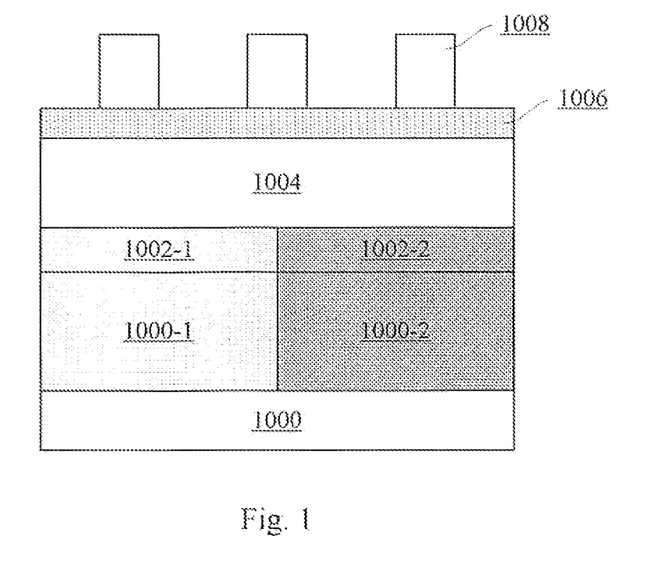
FIGS. 1 to 13 are schematic views showing a flow for manufacturing a semiconductor device according to an embodiment of the present disclosure.

As shown in FIG. 1, a substrate 1000 is provided. The substrate 1000 may comprise any suitable substrate in various forms, for example, but not limited to, bulk semiconductor substrate, such as bulk Si substrate, Semiconductor On Insulator (SOI) substrate, SiGe substrate and the like. In the following, a bulk Si substrate is described by way of example for convenience of description.

An n-type well 1000-1 and a p-type well 1000-2 may be formed in the substrate 1000, so that a p-type device and an n-type device may be formed later therein, respectively. For example, the n-type well 1000-1 may be formed by implanting n-type impurities (such as P or As) into the substrate 1000, and the p-type well 1000-2 may be formed by implanting p-type impurities (such as B) into the substrate 1000. If required, annealing may be performed after the implantation. To those skilled in the art, the n-type and p-type wells may be formed in various ways, and detailed descriptions thereof will be omitted here.

It is to be noted that a process of forming complementary devices in the respective n-type and p-type wells will be described below, but the present disclosure is not limited thereto. The present disclosure is also applicable to a non-complementary process, for example. Further, some of the following processes related to the complementary devices may be not necessary in some implementations.

A first semiconductor layer 1002 may be formed on the substrate 1000 by, for example, epitaxy. In an example, the first semiconductor layer 1002 may comprise SiGe (wherein Ge may have an atomic percentage of about 5-20%), with a thickness of about 10-50 nm. The first semiconductor layer may be doped in-situ while being grown, for example, into p-type by using B. The first semiconductor layer may have a doping concentration higher than that of the underlying p-type well, for example, 1E18-2E19 cm$^{-3}$. In an example, the first semiconductor layer 1002 of p-type may be implanted with C in order to reduce B diffusion. Preferably, the concentration of Ge has a graded distribution in a vertical direction. Specifically, the concentration of Ge (which is embodied by the atomic percentage of Ge in SiGe) may reduce gradually from the middle towards top and bottom surfaces of the first semiconductor layer, respectively.

A portion of the first semiconductor layer on the p-type well may be shielded by photoresist (not shown), and a portion of the first semiconductor layer on the n-type well may be implanted with n-type impurities, such as As or P, and thus converted into n-type, with a doping concentration higher than that of the underlying n-type well, for example, 2E18-4E19 cm$^{-3}$. The photoresist may be then removed. As such, a first n-type semiconductor layer 1002-1 and a first p-type semiconductor layer 1002-2 are formed.

Next, a second semiconductor layer 1004 may be formed on the first semiconductor layer 1002 (including 1002-1 and 1002-2) by, for example, epitaxy. The second semiconductor layer 1004 may comprise Si, with a thickness of about 20-100 nm.

A protection layer 1006 may be formed on the second semiconductor layer 1004. For example, the protection layer 1006 may comprise oxide (for example, silicon oxide) with a thickness of about 10-50 nm. Such a protection layer 1006 can protect end portions of fins in subsequent processes.

The formed second semiconductor layer 1004, the first semiconductor layer 1002 and the substrate may be then patterned to form initial fins. For example, this can be done as follows. In particular, photoresist 1008 may be formed and then patterned as designed on the protection layer 1006. The photoresist 1008 is generally patterned into a series of parallel equispaced lines. Then, as shown in FIG. 2, the protection layer 1006, the second semiconductor layer 1004, the first semiconductor layer 1002 and the substrate may be sequentially selectively etched by, for example, Reactive Ion Etching (RIE), with the photoresist 1008 as mask, thereby forming the initial fins.

Figure 3:
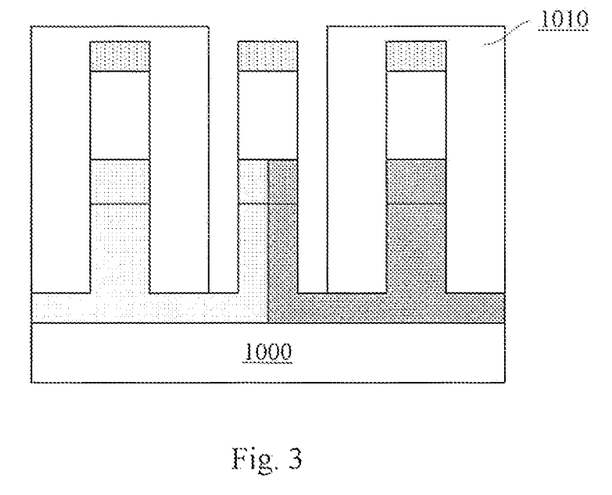

In the case of the complementary process, an isolation may be formed between the n-type and p-type regions as shown in FIG. 3. In particular, photoresist 1010 may be formed on the substrate, and then patterned to expose a region around an interface between the n-type and p-type regions. Then, portions of the protection layer and the second and first semiconductor layers existing in this region are selectively etched by, for example, RIE. The substrate may be further selectively etched by, for example, RIE. As such, an isolation zone is formed between the n-type and p-type regions, and may subsequently be filled with dielectric. Then, the photoresist 1010 may be removed.

Figure 2:
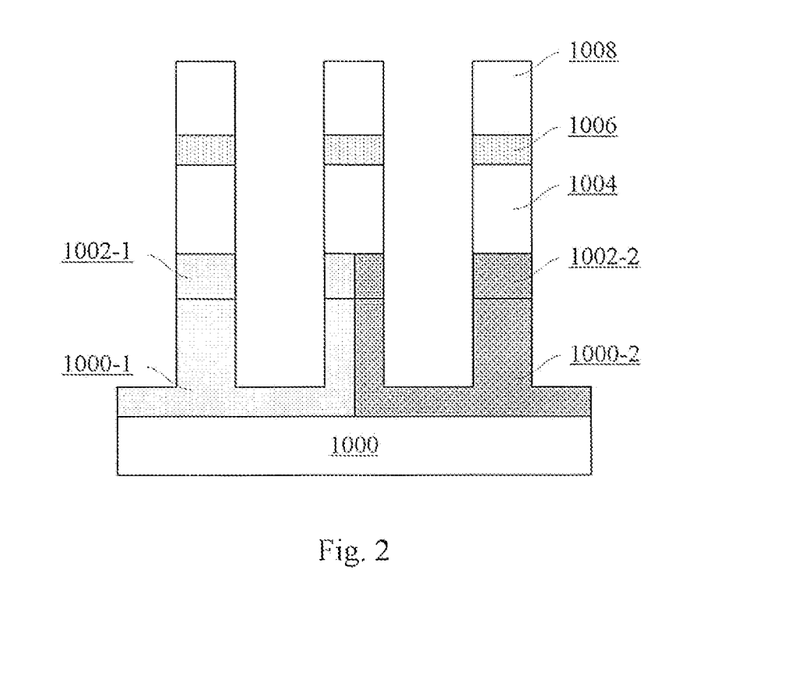

It can be seen that in the process of FIG. 2, the etching for forming the original fins is performed into the substrate 1000. Then, with the process of FIG. 3, a contact area between the p-type and n-type wells (i.e., an area of a resultant pn junction) may be made small. However, the present disclosure is not limited thereto. For example, in the non-complementary-process or in a local region of devices of a single type (p-type or n-type), the etching of the first semiconductor layer 1002 as described above in conjunction with FIG. 2 may stop on the substrate 1000, and it is not necessary to further etch the substrate 1000; and the process of FIG. 3 may be performed but not necessary. Trenches (between the initial fins) formed by the etching may have a shape different from the regular rectangular shape as shown in FIG. 2, such as a tapered shape narrowed from top down. In addition, the positions and number of the formed initial fins are not limited to the example as shown in FIG. 2.

Figure 4:
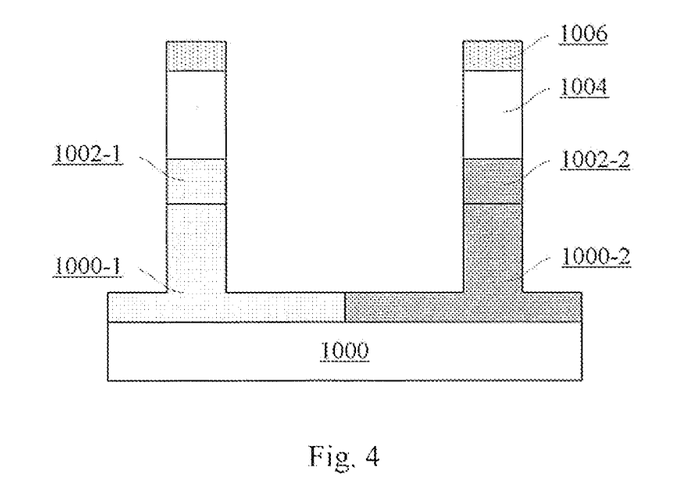

In the example of FIG. 2, an initial fin is also formed at the interface between the n-type well 1000-1 and the p-type well 1000-2. The initial fin is then removed by the isolation forming process of FIG. 3, resulting in the structure shown in FIG. 4.

Figure 5:
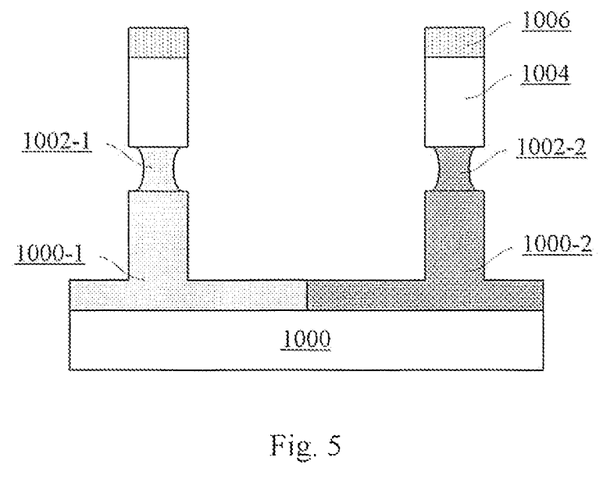

To reduce a parasitic capacitance at the bottom of the finally-formed fins, the first semiconductor layer 1002 (such as SiGe) may be selectively etched with respect to the protection layer 1006 (for example, silicon oxide), and also the substrate 1000 and the second semiconductor layer 1004 (such as Si), so that the first semiconductor layer 1002 is recessed in a lateral direction, as shown in FIG. 5. Therefore, a portion of the initial fin that is constituted by the first semiconductor layer is narrowed. In a case where the first semiconductor layer 1002 comprises SiGe in which the concentration of Ge has a graded distribution, the etching intensity of the first semiconductor layer 1002 is relatively great at its middle portion with a relatively high Ge concentration, and reduces gradually towards the top and bottom surfaces of the first semiconductor layer 1002 with a relatively low Ge concentration.

Figure 6:
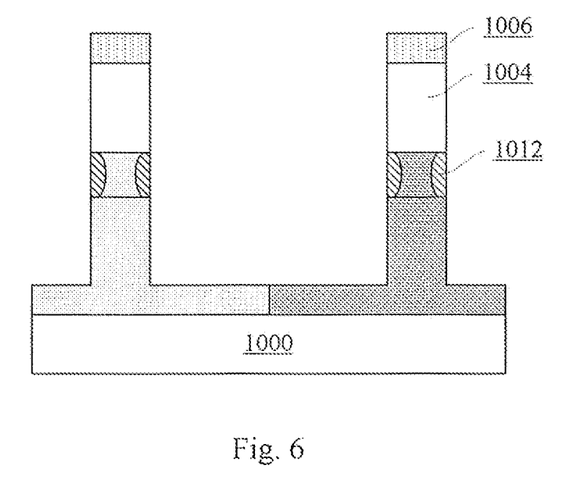

Then, as shown in FIG. 6, the lateral recess is filled with a dielectric material to form a body spacer 1012. For example, the filling may be performed by depositing the dielectric material, and then etching it back (by, for example, RIE). The body spacer 1012 may comprise nitride (for example, silicon nitride) or a low-K dielectric such as SiOF, SiCOH, SiO, SiCO and SiCON. In a case where the deposited dielectric comprises nitride, a thin oxide layer (not shown) may be optionally deposited as a pad layer before depositing the dielectric, to mitigate stress of the nitride.

After the initial fins having the respective body spacers are formed in the above process, gate stacks intersecting the respective fins may be formed to achieve final semiconductor devices.

To isolate the gate stacks from the substrate, an isolation layer may be formed on the substrate. This isolation layer may be formed, for example, by depositing a dielectric material on the substrate, and then etching it back. In the back-etching, an etching depth may be controlled so that the back-etched isolation layer makes a portion of the body spacer expose (or protrude relative to a top surface of the isolation layer). In an example, the isolation layer may include High Density Plasma (HDP) oxide, such as silicon oxide.

Figure 7:
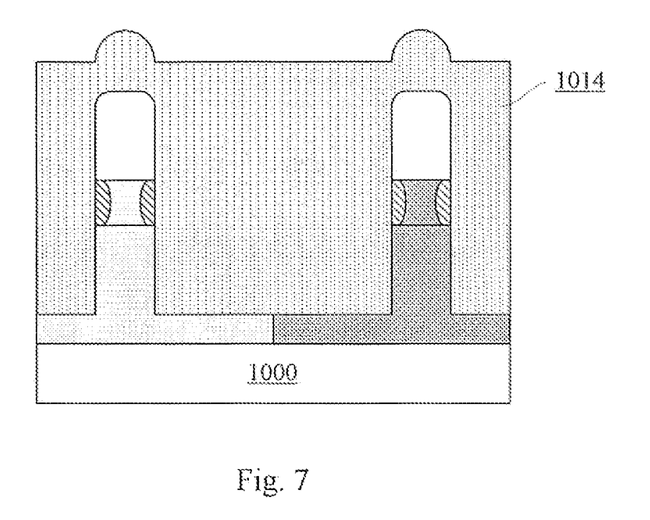

To improve uniformity in level of (the top surface of) the isolation layer after being etched back, and thus improve uniformity in height of the finally-formed fins, the dielectric material 1014 may be deposited in such a way that it substantially covers the initial fin (i.e., in case of multiple initial fins, substantially fills up gaps between the initial fins), as shown in FIG. 7. According to embodiments of the present disclosure, the dielectric material may be deposited such that a portion of the dielectric material on top of the initial fins has a thickness sufficiently less than that of a portion of the dielectric material on the substrate. In general, the thickness of the portion of the dielectric material on top of the initial fins is less than ⅓, preferably ¼, of the thickness of the portion of the dielectric material on the substrate. In an example, the portion of the dielectric material on top of each of the initial fins may have a thickness no more than 20 nm, and the portion of the dielectric material on the substrate may have a thickness up to about 100 nm.

According to an example of the present disclosure, the dielectric material 1014 may comprise oxide (e.g., silicon oxide) formed by High Density Plasma (HDP) deposition. Due to characteristics of HDP, the thickness of the dielectric material on top of the initial fins (in a direction perpendicular to the substrate) and on side surfaces of the initial fins (in a direction parallel to the substrate, i.e., a lateral direction) is less than that of the dielectric material between the initial fins on the substrate (in a direction perpendicular to the substrate) during the deposition. Due to such characteristics, the HDP deposition is conventionally not used to make oxide isolation.

Here, by controlling, for example, deposition conditions, the thickness of the portion of the dielectric material 1014 on top of each of the initial fins may be less than ½ of a spacing between the initial fin and its neighboring initial fin when the dielectric material 1014 substantially covers the initial fins (or substantially fills up the gaps between the initial fins). If spacings between the initial fins are not the same, the thickness of the portion of the dielectric material 1014 on top of each of the initial fins may be less than ½ of a narrower one of the spacings between the initial fin and its neighboring initial fins.

Figure 8:
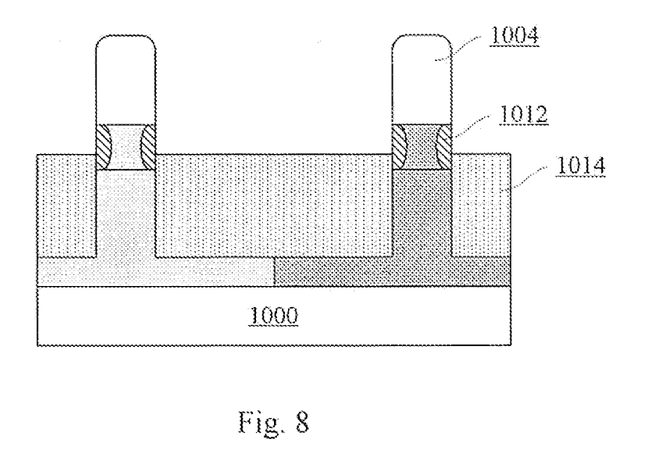

Next, the dielectric material 1014 is etched back as shown in FIG. 8. As the back-etching of the dielectric material 1014 is performed with a relatively small depth, it is relatively easy to control the etching, and it is thus possible to more accurately control a distance from the top surface of the fin (in this example, the top surface of the second semiconductor layer 1004) to the top surface of the isolation layer 1014 (which determines at least partially a fin height of the final device and thus a channel width of the final device), so that the distance is kept substantially constant across the substrate. In this way, the isolation layer may define the fins above the isolation layer. In an example where the first semiconductor layer 1002-1 and 1002-2 is doped as described above, it results in a threshold voltage higher than that in the second semiconductor layer 1004. Therefore, by controlling a gate control voltage, the second semiconductor layer may be conducted while the first semiconductor layer may not be conducted. As such, the fins used in the final devices may include only the second semiconductor layer 1004, and the first semiconductor layer 1002 may act as a punch-through stopper to prevent punch-through between source and drain.

Preferably, before depositing the dielectric material 1014, the initial fins may be oxidized, so that top corners of the initial fins are rounded. The rounded corners facilitate improving reliability of the device.

In an example, the protection layer 1006 and the dielectric material 1014 comprise the same material, such as oxide. Therefore, in the process of etching back the dielectric material 1014, the protection layer 1016 may be removed at the same time, as shown in FIG. 8.

Figure 9:
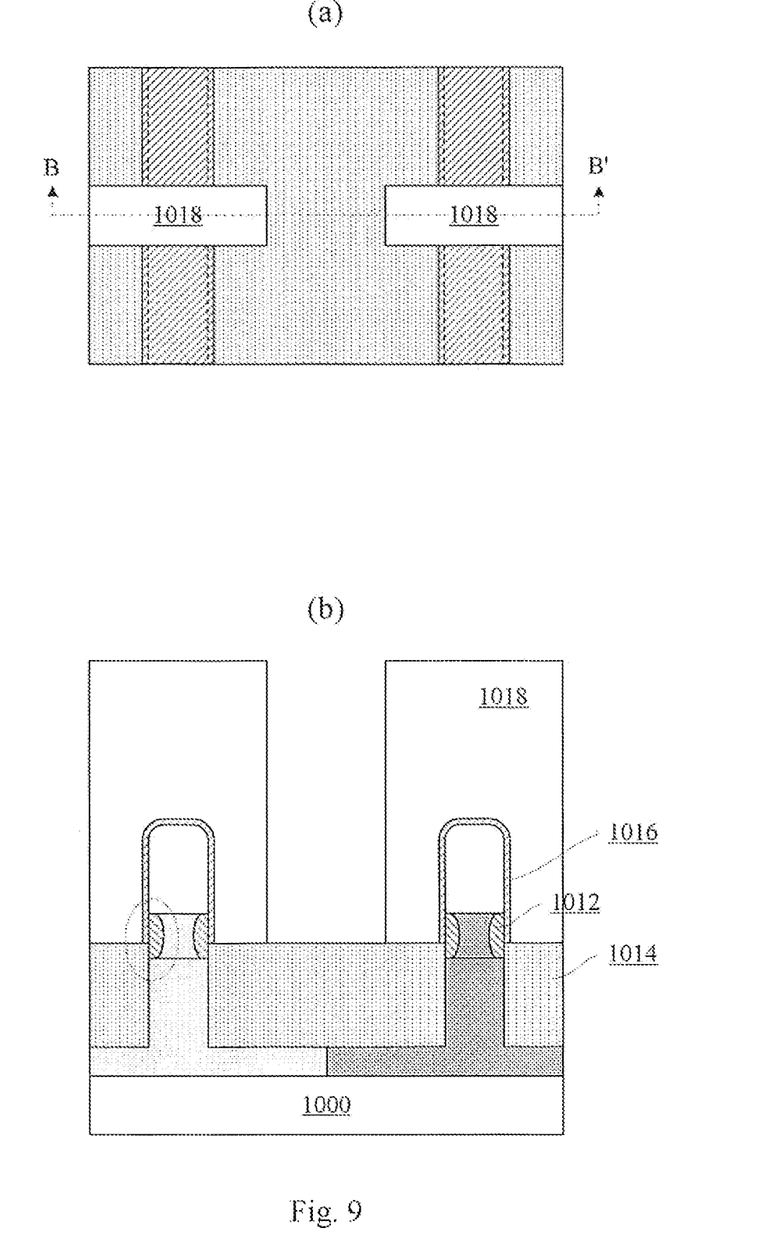

Then, gate stacks intersecting the respective fins may be formed on the isolation layer 1014. For example, this may be done as follows. In particular, as shown in FIG. 9 (FIG. 9(*b*) illustrates a cross-sectional view along line BB' in FIG. 9(*a*)), a gate dielectric layer 1016 may be formed through, for example, deposition. The gate dielectric layer 1016 may comprise, for example, oxide with a thickness of about 0.8-1.5 nm. Although the gate dielectric layer 1016 is shown in FIG. 9 as a shape of "Π," the gate dielectric layer 1016 may also include a portion extending on to the top surface of the isolation layer 1014. Then, a gate conductor layer 1018 may be formed through, for example, deposition. The gate conductor layer 1018 may comprise, for example, polysilicon. The gate conductor layer 1018 may fill up the gaps between the fins, and may be planarized by, for example, Chemical Mechanical Polishing (CMP). Next, the gate conductor layer 1018 is patterned to form the gate stacks. The gate conductor layer 1018 is patterned into strips intersecting the respective fins in the example of FIG. 9. In another embodiment, the gate dielectric layer 1016 may be further patterned with the patterned gate conductor layer 1018 as a mask.

As denoted by a dotted-line ellipse in FIG. 9(*b*), the body spacer 1012 exists between the gate conductor 1018 and the fin at the bottom of the fin (the portion of the fin beneath the bottom is surrounded by the isolation layer, and thus will not act as a real fin in the final device where the channel is to be formed), resulting in a relatively small parasitic capacitance.

After forming the patterned gate conductor, halo implantation and extension implantation may be performed with the gate conductor as a mask, for example.

Figure 10:
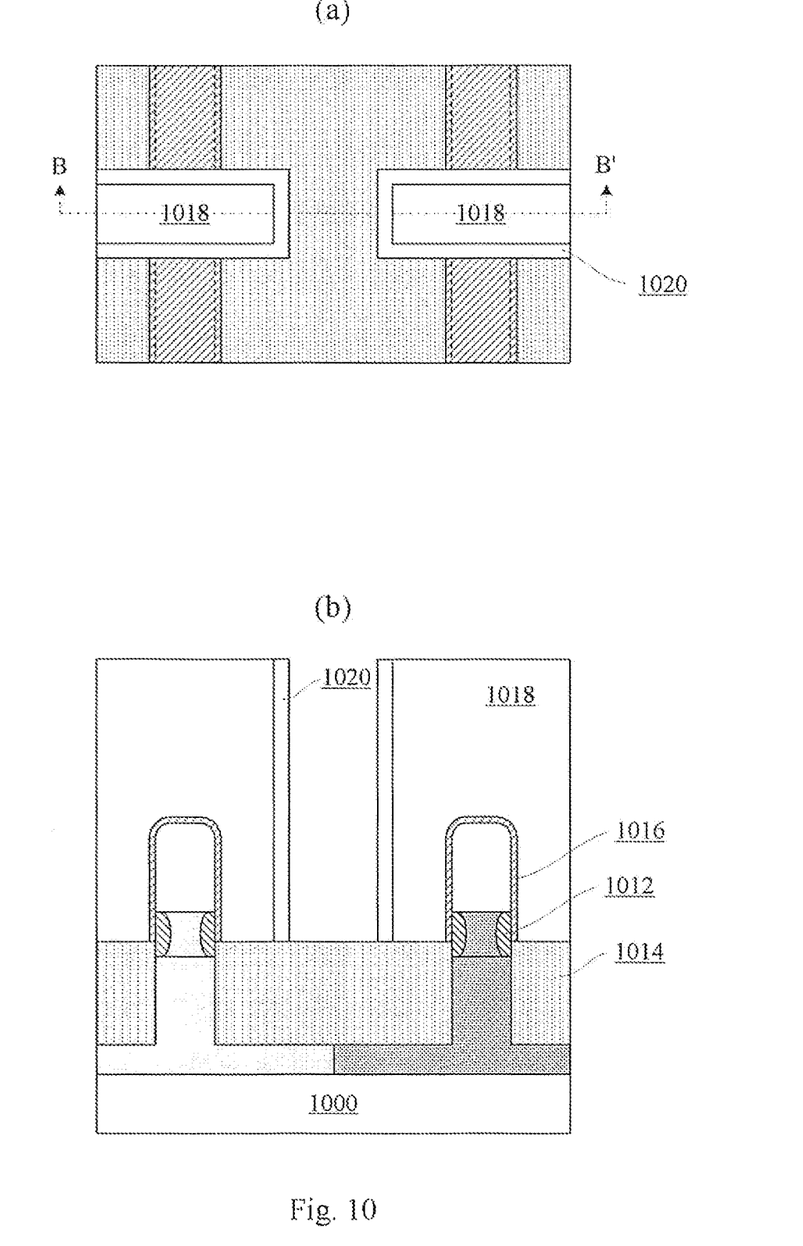

Next, as shown in FIG. 10 (FIG. 10(*b*) shows a cross-sectional view along line BB' in FIG. 10(*a*)), a spacer 1020 may be formed on side walls of the gate conductor layer 1018. The spacer 1020 may be formed by, for example, depositing a nitride layer with a thickness of about 5-30 nm, and then applying RIE on the nitride layer. There are various approaches for forming such a spacer, and details thereof will be omitted here.

The spacer 1020 includes substantially no portion formed on side walls of the fins when the trenches between the fins have a tapered shape narrowed from top down (it is generally the case due to characteristics of the etching).

After forming the spacer, source/drain (S/D) implantation may be performed with the gate conductor and the spacer as a mask. Then, the implanted ions may be activated through annealing to form source/drain regions, resulting in the semiconductor device of the embodiment. As shown in FIG. 10, the semiconductor device may comprise: the substrate; the patterned first and second semiconductor layers sequentially formed on the substrate; the isolation layer formed on the substrate, wherein the isolation layer has a top surface located between top and bottom surfaces of the first semiconductor layer, and thus defines a fin above the isolation layer; and the gate stack formed on the isolation layer and intersecting the fin. The first semiconductor layer may comprise a compound semiconductor, and at least one component in the compound semiconductor may have a concentration with a graded distribution in the height direction of the fin. The first semiconductor layer may be recessed in the lateral direction with respect to the second semiconductor layer, and the semiconductor device may further comprise the body spacer formed in the lateral recess. In addition, the top corners of the fin may be rounded. For a p-type device, the first semiconductor layer may be doped with n-type impurities, while for an n-type device, the first semiconductor layer may be doped with p-type impurities. Such a doped first semiconductor layer may act as a punch-through stopper.

In the above embodiment, the gate stacks are formed directly after the formation of the fins. The present disclosure is not limited thereto, and the gate last process is also applicable.

In a further embodiment of the present disclosure, the gate dielectric layer 1016 and the gate conductor layer 1018 formed in FIG. 9 may be a sacrificial gate dielectric layer and a sacrificial gate conductor layer, respectively. Subsequent processes may be performed in the way described above in conjunction with FIGS. 9 and 10.

Figure 11:
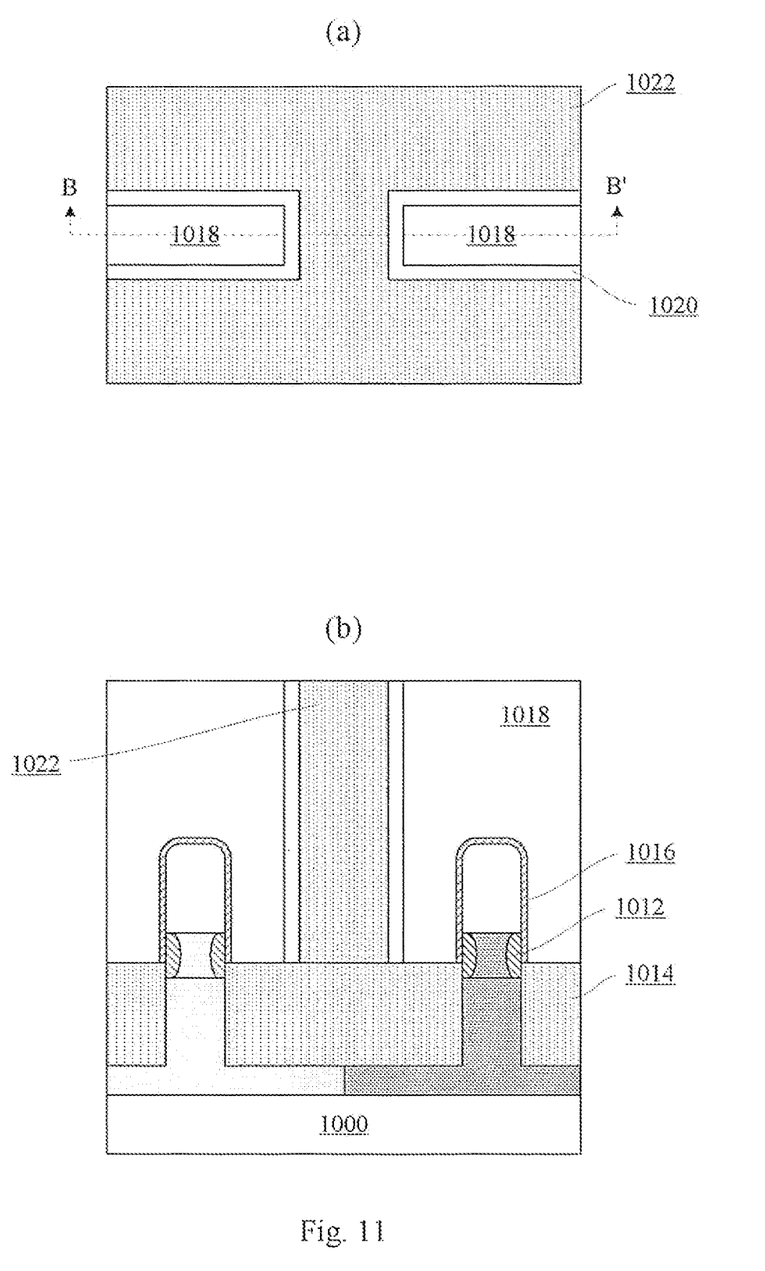

Next, as shown in FIG. 11 (FIG. 11(*b*) shows a cross-sectional view along line BB' in FIG. 11(*a*)), a further dielectric layer 1022 may be formed through, for example, deposition. The dielectric layer 1022 may comprise oxide, for example. Then, the dielectric layer 1022 is planarized by, for example, CMP, which may stop at the spacer 1020, thereby exposing the sacrifice gate conductor layer 1018.

Figure 12:
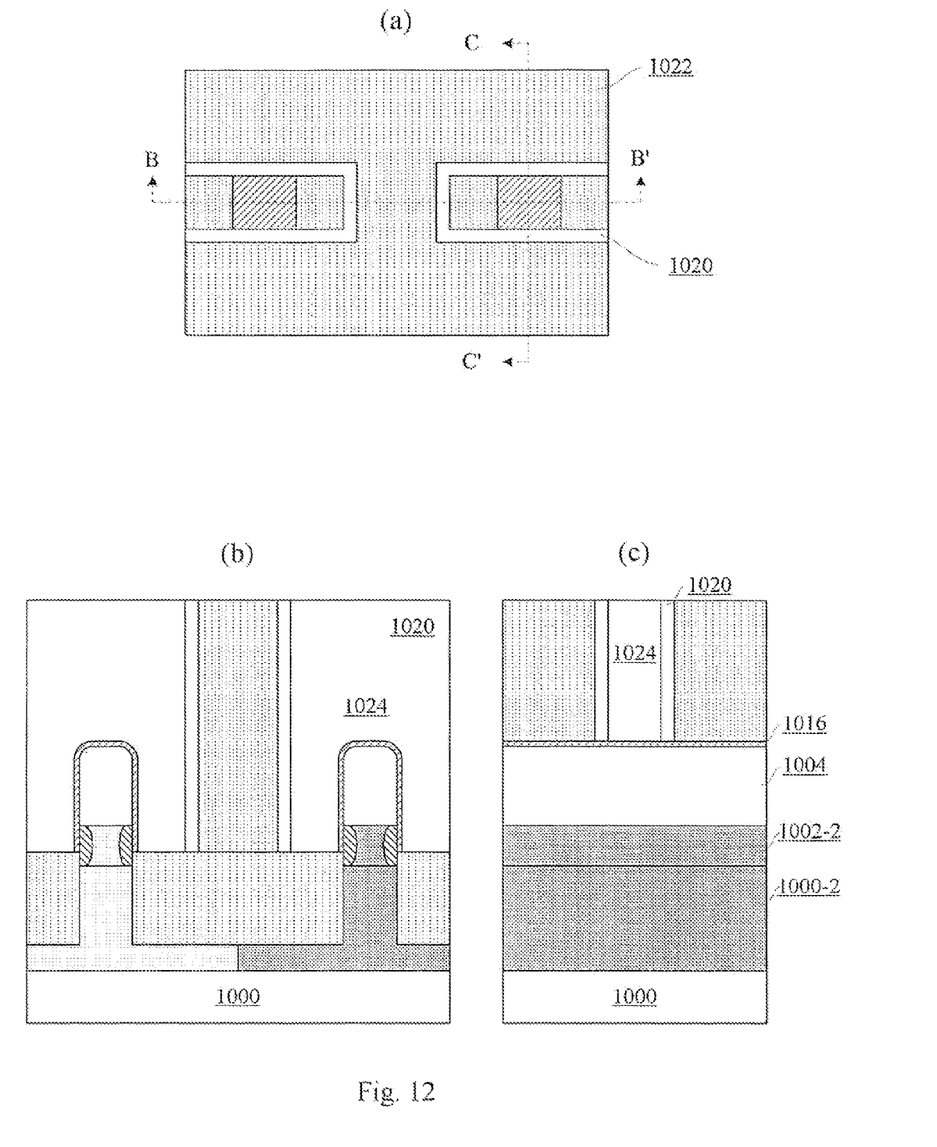

Subsequently, as shown in FIG. 12 (FIG. 12(*b*) shows a cross-sectional view along line BB' in FIG. 12(*a*), and FIG. 12(*c*) shows a cross-sectional view along line CC' in FIG. 12(*a*)), the sacrifice gate conductor layer 1018 may be selectively removed by, for example, a TMAH solution, and thus a void 1024 is formed within the spacer 1020. In another example, the sacrifice gate dielectric layer 1016 may be further removed.

Figure 13:
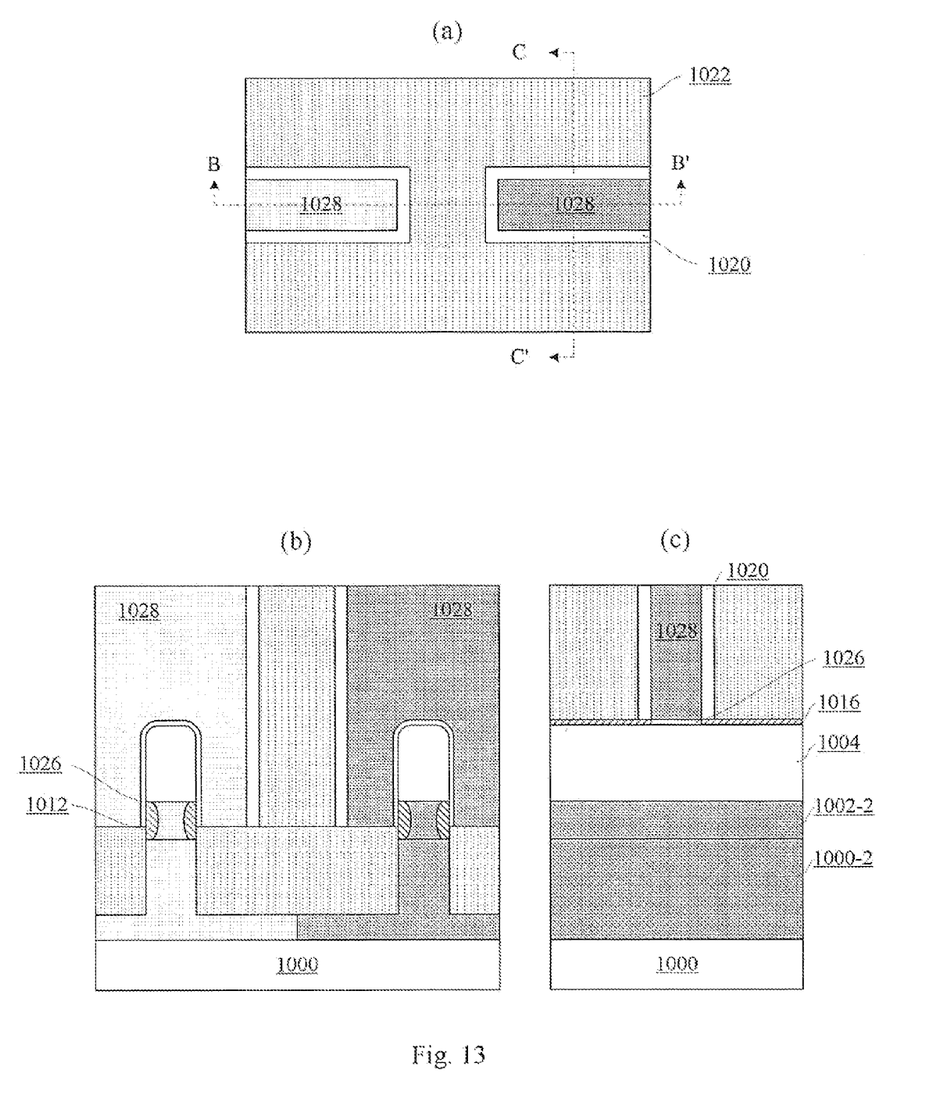

Next, as shown in FIG. 13 (FIG. 13(*b*) shows a cross-sectional view along line BB' in FIG. 13(*a*), and FIG. 13(*c*) shows a cross-sectional view along line CC' in FIG. 13(*a*)), a final gate stack is formed by forming a gate dielectric layer 1026 and a gate conductor layer 1028 in the void 1024. The gate dielectric layer 1026 may comprise a high-K gate dielectric, such as $HfO_2$, with a thickness of about 1-5 nm. The gate conductor layer 1028 may comprise a metal gate conductor. Further, a work function adjustment layer (not shown) may be formed between the gate dielectric layer 1022 and the gate conductor layer 1024.

Although the gate dielectric layer 1026 is shown in FIG. 13 as a thin layer at the bottom of the void 1024, the gate dielectric layer 1026 may be also formed on side walls of the void 1024 and thus surround the gate conductor layer 1028.

As such, the semiconductor device according to the embodiment is obtained. The structure of the semiconductor device is substantially the same as the semiconductor device of FIG. 10, except that the gate stack is formed in a different manner.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

I claim:

1. A semiconductor device comprising:
   a substrate;
   patterned first and second semiconductor layers sequentially formed on the substrate;
   an isolation layer formed on the substrate, wherein the isolation layer has a top surface located between top and bottom surfaces of the first semiconductor layer, and thus defines a fin comprising the patterned first and second semiconductor layers above the isolation layer and extending in a first direction;
   a gate stack formed on the isolation layer and extending in a second direction crossing the first direction to intersect the fin,
   wherein the first semiconductor layer comprises a compound semiconductor, with at least one component whose concentration has a graded distribution in a height direction of the fin and
   wherein the first semiconductor layer is recessed with respect to the second semiconductor layer in the second direction so as to define a lateral recess therein, and the semiconductor device further comprises a dielectric body spacer formed in the lateral recess.

2. The semiconductor device according to claim 1, wherein the substrate comprises Si, the first semiconductor layer comprises SiGe, the second semiconductor layer comprises Si, and the concentration of Ge in the first semiconductor layer has a graded distribution.

3. The semiconductor device according to claim 2, wherein the concentration of Ge in the first semiconductor layer reduces gradually from the middle of the first semiconductor layer towards the substrate and the second semiconductor layer, respectively.

4. The semiconductor device according to claim 1, wherein top corners of the initial fin are rounded.

5. The semiconductor device according to claim 1, wherein the first semiconductor layer is doped with n-type impurities for a p-type device, or is doped with p-type impurities for an n-type device.

6. The semiconductor device of claim 1, wherein there are two said body spacers each sandwiched between the gate stack and a corresponding side wall of the first semiconductor layer.

7. The semiconductor device of claim 1, wherein the second semiconductor layer has its side walls opposite to each other in the second direction covered by the gate stack, and the first semiconductor layer has its side walls opposite to each other in the second direction positioned inwards with respect to the respective side walls of the second semiconductor layer to define the lateral recess.

8. The semiconductor device of claim 1, wherein a portion of the fin intersecting the gate stack defines a channel region, and wherein the device further comprises a source region and a drain region formed in portions of the fin on opposite sides with respect to the channel region, wherein the first direction is a direction from the source region to the drain region or vice versa.

9. The semiconductor device of claim 1, wherein the first semiconductor layer has a length in the first direction substantially the same as that of the second semiconductor layer in the first direction.

10. The semiconductor device of claim 9, wherein the first semiconductor layer is in physical contact with the second semiconductor layer in substantially all the length thereof.

* * * * *